(12) United States Patent
Peake

(10) Patent No.: US 10,032,907 B2
(45) Date of Patent: Jul. 24, 2018

(54) TRENCHMOS

(71) Applicant: Nexperia B.V., Nijmegen (NL)

(72) Inventor: Steven Thomas Peake, Warrington (GB)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/285,351

(22) Filed: Oct. 4, 2016

(65) Prior Publication Data

US 2018/0097105 A1    Apr. 5, 2018

(51) Int. Cl.

| | |
|---|---|
| *H01L 29/36* | (2006.01) |
| *H01L 29/78* | (2006.01) |
| *H01L 29/423* | (2006.01) |
| *H01L 21/265* | (2006.01) |
| *H01L 29/06* | (2006.01) |
| *H01L 21/225* | (2006.01) |
| *H01L 29/10* | (2006.01) |

(52) U.S. Cl.
CPC ...... *H01L 29/7827* (2013.01); *H01L 21/2253* (2013.01); *H01L 21/2652* (2013.01); *H01L 29/063* (2013.01); *H01L 29/105* (2013.01); *H01L 29/1045* (2013.01); *H01L 29/4236* (2013.01); *H01L 29/7813* (2013.01)

(58) Field of Classification Search
CPC ........... H01L 29/7813; H01L 29/66734; H01L 29/0619
See application file for complete search history.

(56) References Cited

U.S. PATENT DOCUMENTS

2013/0146967 A1* 6/2013 Peake ............... H01L 29/66734
257/330

* cited by examiner

*Primary Examiner* — Thomas L Dickey
(74) *Attorney, Agent, or Firm* — Ohlandt, Greeley, Ruggiero & Perle, L.L.P.

(57) ABSTRACT

A device is disclosed. The device comprises a substrate having an epitaxial layer of a first conductivity type, a deep trench of a first depth, a pillar region of a second conductivity type of a second depth and a blocking layer of a third conductivity type immediately below a bottom surface of the deep trench. The second depth is larger than the first depth.

17 Claims, 3 Drawing Sheets

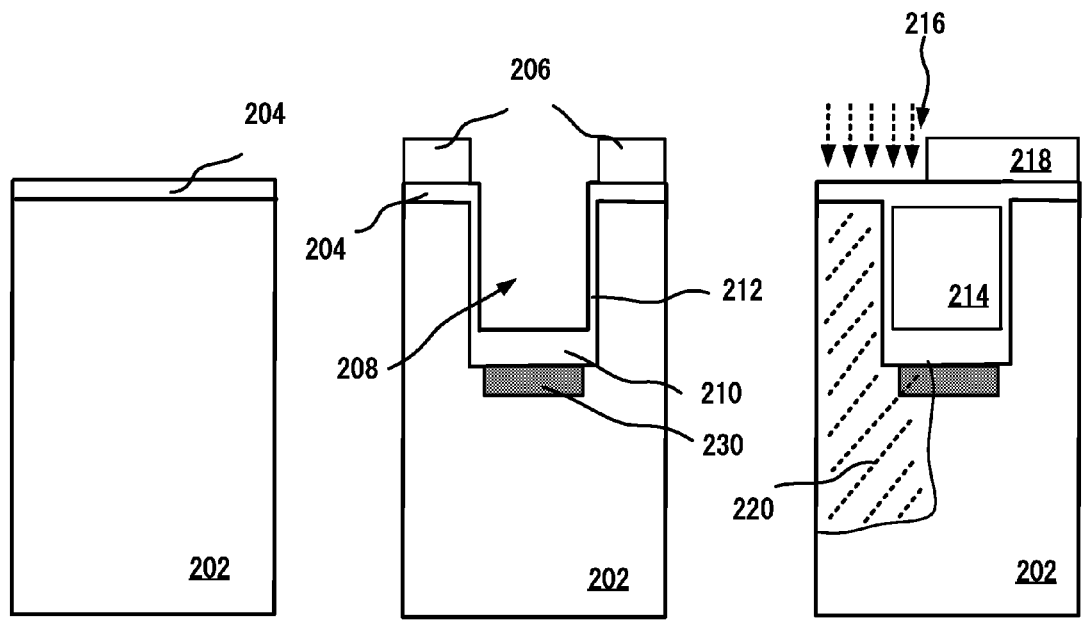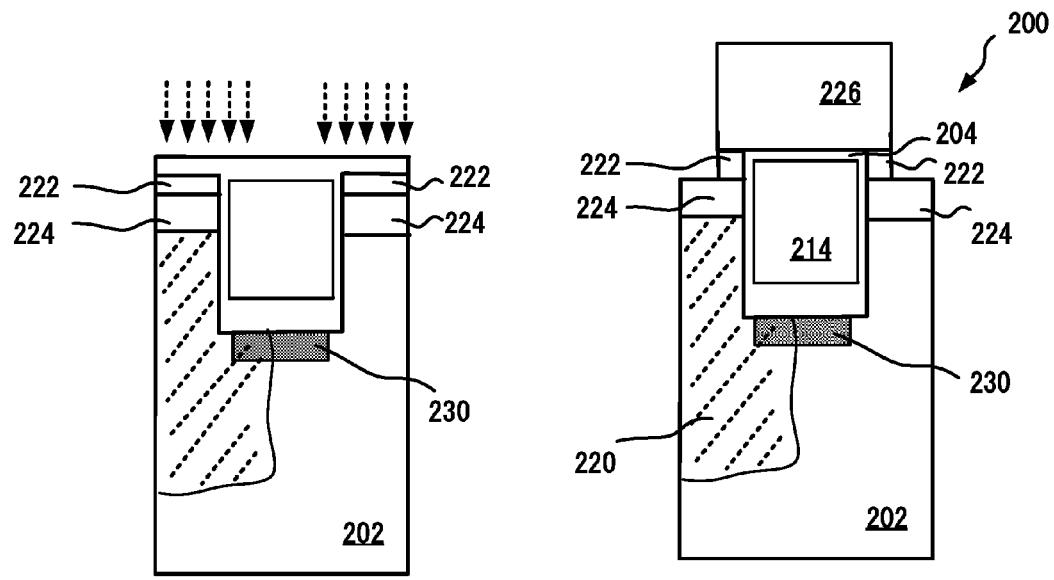

TRENCHMOS

BACKGROUND

Trench gate technology is commonly used for improved break down voltage characteristics in semiconductor devices, especially high voltage devices. In the trench gate technology, the gate is vertically buried in the source, typically separated by an isolation cover. Other advantages of the trench gate technology include reduced junction gate field effect transistor (JFET) effect that may be undesirable at least in some applications. However, the trench gate technology does offer some disadvantages when lower voltage configurations are desired due to a need to reduce the width of the embedded gate. Reduced Surface Field (RESURF) technology is one of the most widely-used methods for the design of lateral high-voltage, low on-resistance devices. The technique has allowed the integration of high voltage devices, ranging from 20 V to 1200 V, with bipolar and MOS transistors.

TrenchMOS (Metal Oxide Semiconductor with trench gate) semiconductor devices are commonly used for power applications. A TrenchMOS device typically includes a semiconductor substrate having a layer of epitaxially grown, doped silicon located thereon, in which is formed a trench containing a gate electrode and gate dielectric. A source region of the device is located adjacent an upper part of the trench. The device also includes a drain region, which is separated from the source region by a body region, through which the trench extends.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a device is disclosed. The device comprises a substrate having an epitaxial layer of a first conductivity type, a deep trench of a first depth, a pillar region of a second conductivity type of a second depth and a blocking layer of a third conductivity type immediately below a bottom surface of the deep trench. The second depth is larger than the first depth.

In some embodiments, the area of the blocking layer is approximately same as area of the bottom surface of the deep trench and the deep trench is partially filled with a gate oxide layer. Side walls of the deep trench are covered with a gate oxide layer and the remaining empty area of the deep trench is filled with a polysilicon material to form a gate electrode. The device further includes a body region on an upper portion of the pillar region and a source region above the body region. The first conductivity type is n-type, the second conductivity type is p-type and the third conductivity type is n+ type. The blocking layer is formed using arsenic implantation.

In another embodiment, a process of manufacturing a device is disclosed. The process comprises forming an epitaxial layer of a first conductivity type on in a substrate, forming a deep trench using a layer of a hard mask, implanting a blocking layer of a second conductivity type at a bottom of the deep trench, partially filling the deep trench with a gate oxide, filling remaining area of the deep trench with a poly silicon material, forming a pillar of a third conductivity type, wherein the pillar is larger in height that the deep trench on one side of the deep trench and forming a body region over the pillar and a source region over the body region. The process further includes forming dielectric layer over the polysilicon material.

In some embodiments, the pillar is formed through boron implantation and the epitaxial layer is formed using phosphorous implantation. The hard mask is formed using silicon nitride or a similar material. In some embodiments, the pillar is formed through an implantation process such that a portion of area over the deep trench is exposed for implantation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

FIGS. 2A-2E depict a schematic of a section of the device in various incremental stages of fabrication in accordance with one or more embodiments of the present disclosure.

Note that figures are not drawn to scale. Intermediate steps between figure transitions have been omitted so as not to obfuscate the disclosure. Those intermediate steps are known to a person skilled in the art.

DETAILED DESCRIPTION

Many well-known fabrication steps, components, and connectors have been omitted or not described in details in the description so as not to obfuscate the present disclosure. Further, the device and steps described herein are directed to an n-type device. However, a person skilled in the art would appreciate that the steps can also be used to fabricate a p-type device using know differences in fabrication steps for these two types of devices.

Figure 1A:
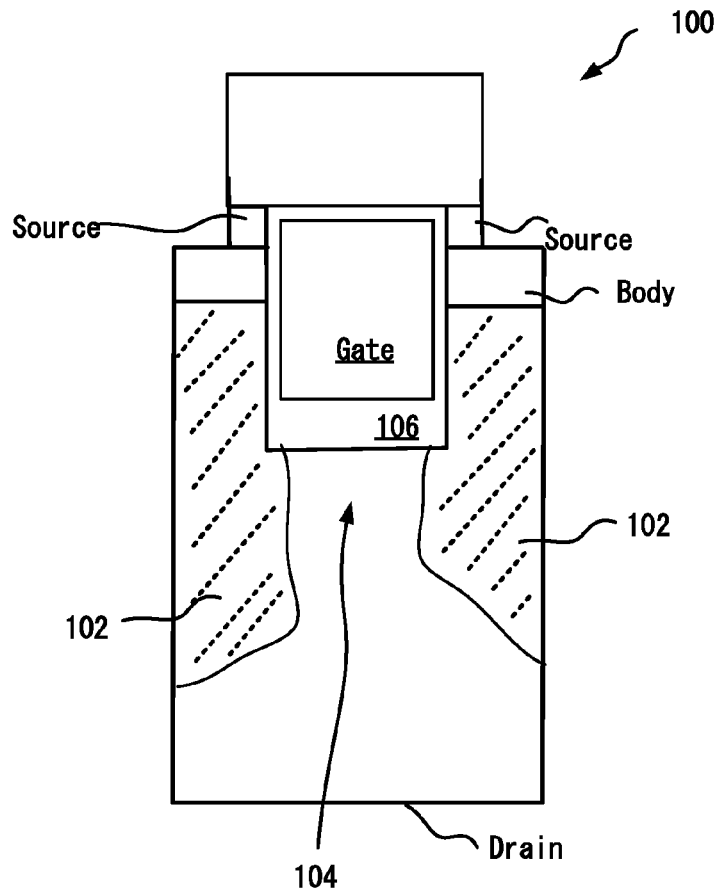
FIGS. 1A-1B depict a schematic of a cross sectional view of a prior art device and performance graph.
Figure 1B:
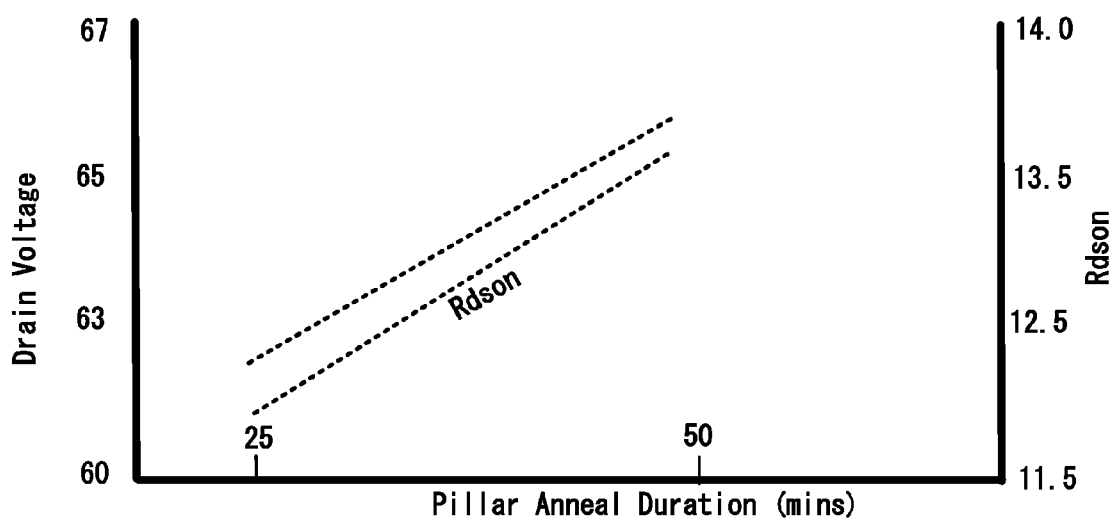

FIG. 1A depicts a schematic of a cross sectional view of a prior art device 100 showing a gate, a drain, a source and a p-type pillar 102. FIG. 1B a graph to shows the p-type pillar anneal duration in mins as a function of the simulated drain voltage. The graph shows that as the p-type anneal increases the drain voltage increases because the p-type pillar 102 spreads laterally in a space 104 under a trench 106. The graph of FIG. 1B also shows the p-type pillar anneal duration in mins as a function of the simulated specific Rdson (Rdson per mm$^2$ of silicon). As the p-type pillar spreads laterally in the space 104 under the trench 106, the drain voltage increases but also the specific Rdson and the cause of the increased specific Rdson is that the p-type pillar pinches more of the current as it moves laterally under the trench.

The On Resistance, Rdson or RDS, on, of a Field Effect Transistor (FET) is a built-in parameter of the transistor that represents the transistor's internal resistance when it is in its fully conducting state (when VGS=0). A lower Rdson is desired, among other things, for better efficiency.

FIG. 2A shows a portion of a substrate showing an n-type expitaxial layer (EPI) 202 formed using a material such as phosphorous through well-known techniques. On the top side of the EPI 202, a thin layer of oxide 204 is formed. FIG. 2B shows a silicon nitride hard mask 206 formed on top of the oxide layer 204. A trench 208 is etched while the nitride hard mask 206 protects other parts of the surface.

On the bottom of the trench 208, an n+ type blocking layer 230 is implanted for example using a material such as arsenic. Then a layer of gate oxide 210 is formed at the bottom and on the side walls of the trench 208. Proportionately thick gate oxide layer is formed at the bottom of the trench 208 compared to the sidewalls. Subsequently, as shown in FIG. 2C, a polysilicon gate electrode 214 is formed in the trench 208 and covered with the oxide layer 204. The nitride hard mask layer (or spacers) 206 is removed.

A photoresist layer 218 is formed on the surface over the oxide layer 204 and portions of the photoresist layer 218 are etched away such that, one embodiment, at least a portion 216 over the gate electrode 214 is exposed. In other embodiments, the portion of the photoresist layer 218 are removed such that the area over the gate electrode 214 remains covered. A p-type Reduced Surface Field (RESURF) region is implanted using a material such as Boron and the implanted region is diffused typically using approximately 1100° C. thermal drive for a short duration. Diffusion is the movement of impurity atoms in a semiconductor material at high temperatures. The driving force of diffusion is the concentration gradient. There is a wide range of diffusivities for the various dopant species, which depend on how easy the respective dopant impurity can move through the material. Diffusion is applied to anneal the crystal defects after ion implantation or to introduce dopant atoms into silicon from a chemical vapor source. In the last case the diffusion time and temperature determine the depth of dopant penetration.

As depicted in FIG. 2D, body 224 and source 222 regions are the formed. As shown in FIG. 2E, a tetraethylorthosilicate (TEOS) Dielectric layer 226 is formed and a portion of the TEOS dielectric layer including portions of the source regions 22 are etched away. Gate, Source and Drain contacts (not shown) are formed to complete the device 200.

Figure 3:
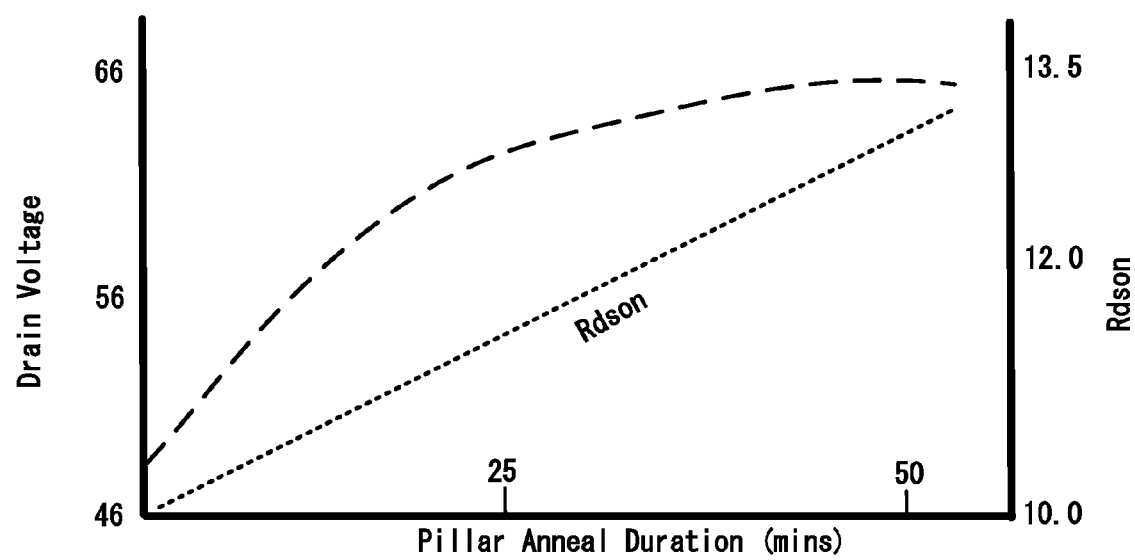
FIG. 3 depicts illustrations to show performance of the device of FIGS. 2A-2E in accordance with one or more embodiments of the present disclosure.

FIG. 3 shows that the n-type implant 230 under the trench 208 reduces the net p-type doping directly under the trench 208, which permits current spreading under the trench 208, thus lowering Rdson.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device, comprising:
   a substrate having an epitaxial layer of a first conductivity type;
   a deep trench of a first depth;
   a pillar region of a second conductivity type of a second depth, wherein the second depth is larger than the first depth; and
   a blocking layer of a third conductivity type immediately below bottom surface of the deep trench,
   wherein the first conductivity type is n-type, the second conductivity type is p-type and the third conductivity type is n+ type.

2. The device of claim 1, wherein the blocking layer has an area that is approximately the same as an area of the bottom surface of the deep trench.

3. The device of claim 1, wherein the deep trench has an area that is partially filled with a gate oxide layer.

4. The device of claim 3, wherein the deep trench has side walls that are covered with a gate oxide layer.

5. The device of claim 4, wherein the deep trench has a remaining empty area that is filled with a polysilicon material to form a gate electrode.

6. The device of claim 5, further including a dielectric layer over the gate electrode.

7. The device of claim 1, further including a body region on an upper portion of the pillar region.

8. The device of claim 7, further including a source region above the body region.

9. The device of claim 1, wherein the blocking layer is formed using arsenic implantation.

10. The method of claim 1, further including forming a dielectric layer over the polysilicon material.

11. The method of claim 1, wherein the pillar is formed through boron implantation.

12. The method of claim 1, wherein the epitaxial layer is formed using phosphorous implantation.

13. The method of claim 1, wherein prior to filling the remaining area of the deep trench with the polysilicon material, side walls of the deep trench are covered with a gate oxide.

14. A process of manufacturing a device, the process comprising:

forming an epitaxial layer of a first conductivity type on in a substrate;

forming a deep trench using a layer of a hard mask;

implanting a blocking layer of a second conductivity type at a bottom of the deep trench;

partially filling an area the deep trench with a gate oxide;

filling a remaining area of the deep trench with a polysilicon material;

forming a pillar of a third conductivity type, wherein the pillar is larger in height that the deep trench on one side of the deep trench; and forming a body region over the pillar and a source region over the body region, wherein the first conductivity type is n-type, the second conductivity type is p-type and the third conductivity type is n+ type.

15. The method of claim 14, wherein the blocking layer is formed using arsenic implantation.

16. The method of claim 14, wherein the hard mask is formed using silicon nitride.

17. The method of claim 15, wherein the pillar is formed through an implantation process such that a portion of an area over the deep trench is exposed for implantation.

* * * * *